(12) United States Patent
Shioyasu et al.

(10) Patent No.: US 10,909,065 B2
(45) Date of Patent: Feb. 2, 2021

(54) MULTIPROCESSOR SYSTEM

(71) Applicant: FUJI XEROX CO., LTD., Tokyo (JP)

(72) Inventors: Asahito Shioyasu, Kanagawa (JP); Shinho Ikeda, Kanagawa (JP); Tomoki Tanihata, Kanagawa (JP); Hisashi Noda, Kanagawa (JP); Kenta Nomura, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/518,993

(22) Filed: Jul. 23, 2019

(65) Prior Publication Data

US 2020/0301872 A1    Sep. 24, 2020

(30) Foreign Application Priority Data

Mar. 19, 2019    (JP) ................................ 2019-050905

(51) Int. Cl.
*G06F 13/40*    (2006.01)
*G06F 15/17*    (2006.01)
*G11C 7/10*    (2006.01)

(52) U.S. Cl.
CPC .......... *G06F 15/17* (2013.01); *G06F 13/4063* (2013.01); *G11C 7/1087* (2013.01); *G06F 2213/16* (2013.01)

(58) Field of Classification Search
None
See application file for complete search history.

(56) References Cited

U.S. PATENT DOCUMENTS 8,255,621 B2    8/2012    Kushita
2018/0088940 A1*    3/2018    Rubanovich ............ G06F 7/483

FOREIGN PATENT DOCUMENTS

WO    2008001671    1/2008

* cited by examiner

*Primary Examiner* — Scott C Sun
(74) *Attorney, Agent, or Firm* — JCIPRNET

(57) ABSTRACT

A multiprocessor system including at least a first processor and a second processor, includes a storage unit that stores a first program executed by the first processor and a second program executed by the second processor, a memory unit that has a memory region used by the second processor, and a monitoring unit that is connected to the storage unit and the memory unit via a communication line, and, in a case where a program read from the storage unit is the second program, stores the read second program into the memory unit.

6 Claims, 8 Drawing Sheets

MULTIPROCESSOR SYSTEM

CROSS-REFERENCE TO RELATED APPLICATIONS

This application is based on and claims priority under 35 USC 119 from Japanese Patent Application No. 2019-050905 filed Mar. 19, 2019.

BACKGROUND

(i) Technical Field

The present invention relates to a multiprocessor system.

(ii) Related Art

WO2008/001671A discloses a multiprocessor system which includes at least a first processor and a second processor, the multiprocessor system including a read only memory that stores a first program executed by the first processor and a second program executed by the second processor; and a random access memory that is connected to be accessed by the first processor and the second processor, and includes a memory region used by the first processor, a memory region used by the second processor, and a memory region shared by the first processor and the second processor, in which the read only memory has a header outside separate codes into which a program is divided, the header storing size information corresponding to each separate code or information indicating whether or not the code is to be transmitted for each activation mode, and in which the first processor accesses the program for the second processor stored in the read only memory, determines whether an instruction for activation is given in a normal mode or a special mode with respect to the activation mode in order to determine whether or not each separate code is required to be transmitted to the second processor, and develops a program corresponding to the determined activation mode into the memory region used by the second processor.

SUMMARY

Aspects of non-limiting embodiments of the present disclosure relate to a multiprocessor system enabling a second processor to be activated faster than in the related art.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a multiprocessor system including at least a first processor and a second processor, the multiprocessor system including a storage unit that stores a first program executed by the first processor and a second program executed by the second processor; a memory unit that has a memory region used by the second processor; and a monitoring unit that is connected to the storage unit and the memory unit via a communication line, and, in a case where a program read from the storage unit is the second program, stores the read second program into the memory unit.

BRIEF DESCRIPTION OF THE DRAWINGS

Exemplary embodiment(s) of the present invention will be described in detail based on the following figures, wherein.

DETAILED DESCRIPTION

Hereinafter, exemplary embodiments of the present invention will be described in detail with reference to the accompanying drawings.

First Exemplary Embodiment

With reference to the drawings, a description will be made of a configuration of a multiprocessor according to a first exemplary embodiment.

Figure 1:
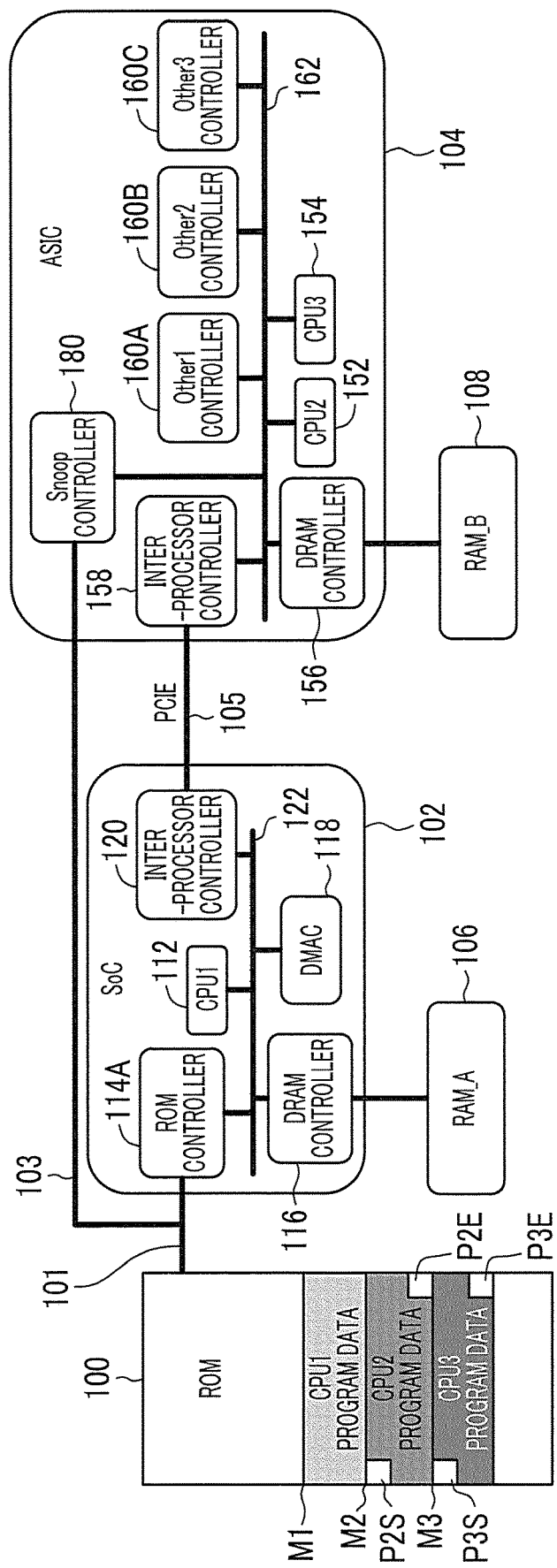
FIG. 1 is a block diagram illustrating a multiprocessor system according to a first exemplary embodiment.

FIG. 1 is a block diagram illustrating a multiprocessor system according to a first exemplary embodiment. As illustrated in FIG. 1, the multiprocessor system includes a plurality of central processing units (CPUs), for example, at least a CPU1_112 and a CPU2_152. Specifically, the multiprocessor system includes a system-on-a-chip (SoC) (integrated circuit) 102 having the CPU1_112, and an application specific integrated circuit (ASIC) 104 having the CPU2_152 and a CPU3_154. The CPU1_112 and the CPU2_152 are respectively examples of a "first processor" and a "second processor" of the technique of the present disclosure.

The multiprocessor system includes a read only memory (ROM) 100. The ROM 100 stores CPU1 program data executed by the CPU1_112, CPU2 program data executed by the CPU2_152, and CPU3 program data executed by the CPU3_154. The ROM 100 is, for example, a nonvolatile memory. The ROM 100 is an example of a "storage unit" of the technique of the present disclosure.

The multiprocessor system includes a random access memory (RAM)_A 106 having a memory region used by the CPU1_112, and a RAM_B 108 having a memory region used by the CPU2_152. Each of the RAM_A 106 and the RAM_B 108 is a volatile memory such as a dynamic random access memory (DRAM). The RAM_B 108 is an example of a "memory unit" of the technique of the present disclosure.

The SoC 102 includes the CPU1_112, a ROM controller (Cont) 114A, a DRAM controller (Cont) 116, a DMA controller (DMAC) 118, and an inter-processor controller (Cont) 120. The constituent elements 112 to 120 are communicably connected to each other via a bus 122. The DRAM controller 116 is connected to the RAM_A 106. The DMAC 118 is an example of a "memory unit" of the technique of the present disclosure.

The ASIC 104 includes the CPU2_152, the CPU3_154, a DRAM controller (Cont) 156, an inter-processor controller (Cont) 158, a plurality of other controllers (an other1 controller 160A, an other2 controller 160B, an other3 controller 160C, . . . ), and a snoop controller 180. The DRAM controller 156 is connected to the RAM_B 108. The snoop controller 180 is an example of a "monitoring unit" of the technique of the present disclosure.

The inter-processor controller 120 and the inter-processor controller 158 are connected to each other via PCI Express (PCIE) 105. Each of the inter-processor controller 120 and the inter-processor controller 158 is an example of an "inter-processor interface circuit" of the technique of the present disclosure.

The ROM 100 is connected to the CPU1_112 and the snoop controller 180 via communication lines. Specifically, the snoop controller 180 is connected to a bus 101 between the ROM 100 and the CPU1_112, via a bus 103.

Figure 5:
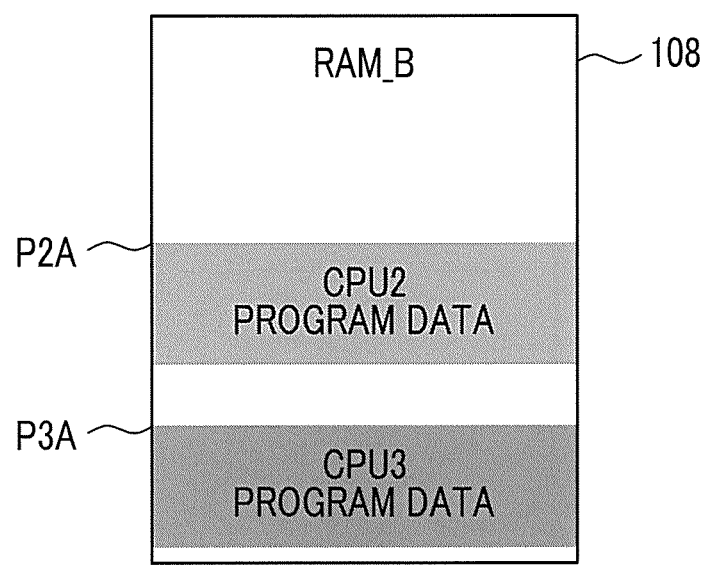
FIG. 5 is a diagram illustrating an example of a region of the RAM_B 108 storing a program.

As will be described later in detail, in a case where program data read from the ROM 100 is the CPU2 program data and the CPU3 program data, the snoop controller 180 stores the read CPU2 program data and CPU3 program data into the RAM_B 108. As illustrated in FIG. 5, the snoop controller 180 stores the CPU2 program data from a predefined program head address P2A for the CPU2 of the RAM_B 108, and stores the CPU3 program data from a predefined program head address P3A for the CPU3.

As described above, the ROM 100 stores the CPU1 program data, the CPU2 program data, and the CPU3 program data. The CPU1 program data is stored in a region between storage positions M1 and M2 of the ROM 100, the CPU2 program data is stored in a region between storage positions M2 and M3 of the ROM 100, and the CPU3 program data is stored in a region subsequent to the storage position M3 of the ROM 100.

The program data stored in the ROM 100 is read from the top to the bottom, and from the left to the right in FIG. 1. The CPU1 program data, the CPU2 program data, and the CPU3 program data are disposed such that program data with a higher activation priority order is disposed at a more front side (a position where the program data is easily read). Consequently, a transmission order of the program data of the CPU2_152 and the CPU3_154 is earlier than in a case where the disposition is not applied, and thus the CPU2_152 and the CPU3_154 are activated earlier than in the case where the disposition is not applied.

Identification data is disposed in the head and the end of each of the CPU2 program data and the CPU3 program data. Specifically, start identification data P2S indicating the head of the CPU2 program data is disposed in the head of the CPU2 program data, and end identification data P2E indicating the end of the CPU2 program data is disposed in the end thereof. Start identification data P3S indicating the head of the CPU3 program data is disposed in the head of the CPU3 program data, and end identification data P3E indicating the end of the CPU3 program data is disposed in the end thereof. In a case where the identification data is disposed in the program data, the snoop controller 180 determines a gap between the CPU1 program data and the CPU2 program data, a gap between the CPU2 program data and the CPU3 program data, and a gap between the CPU3 program data and other program data. The snoop controller 180 may determine the gap between the pieces of program data by using an address in which each piece of program data is stored instead of the identification data. Identification data or an address may be stored in a nonvolatile memory inside or outside the ASIC 104, and an indicator of the program data may be variable or may be set to a value other than a predefined value.

Next, an operation according to the first exemplary embodiment will be described.

Figure 2:
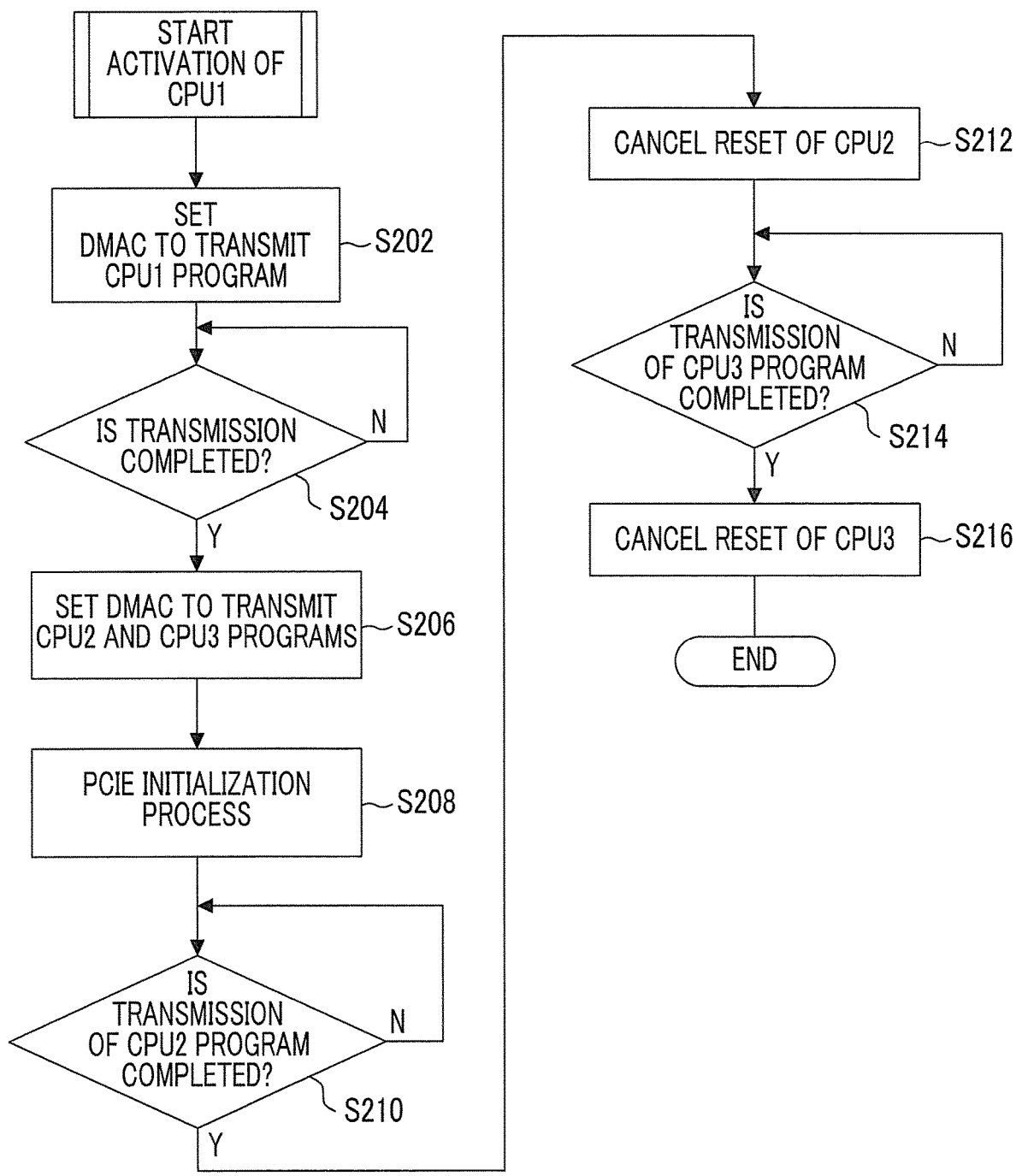
FIG. 2 is a flowchart illustrating a transmission process for CPU2 program data and CPU3 program data, performed by a CPU1_112 executing a CPU1 program.
Figure 3:
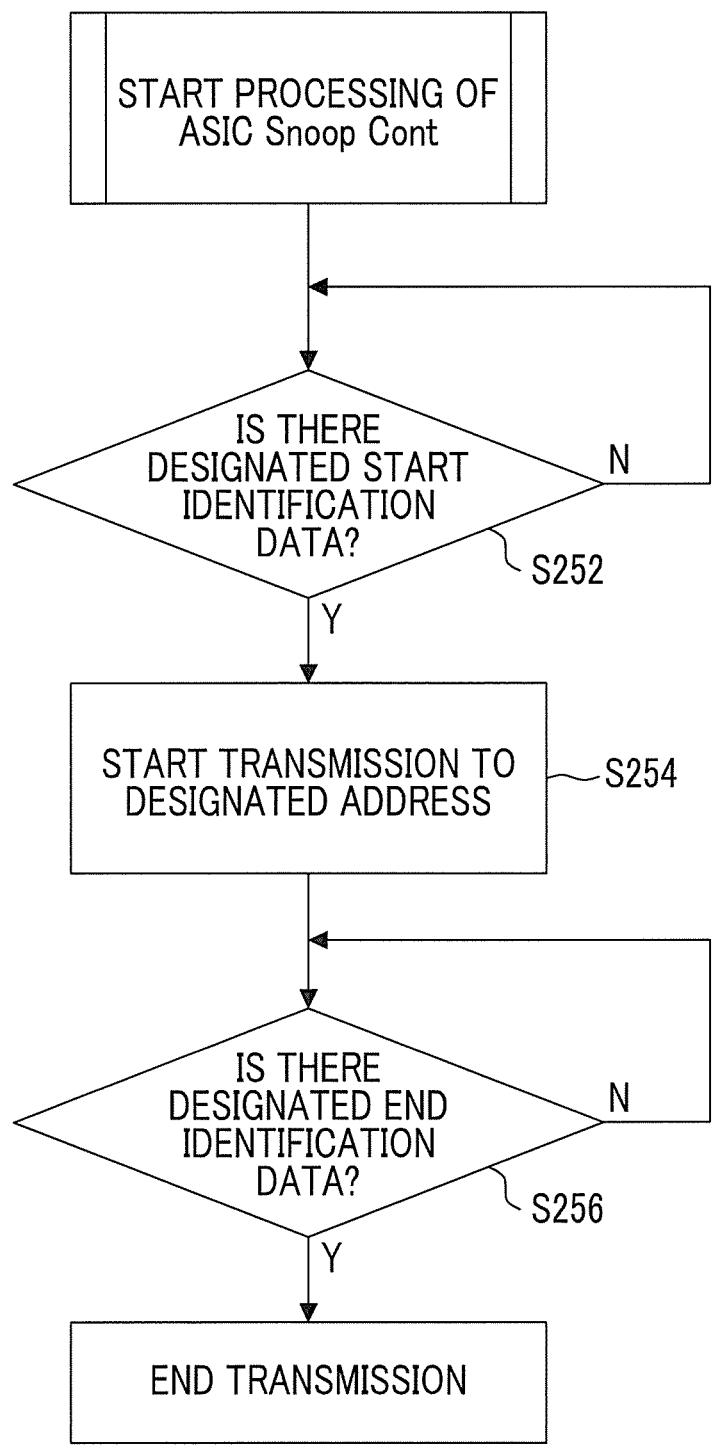
FIG. 3 is a flowchart illustrating a program data storing process, performed by a snoop controller 180, of storing the CPU2 program data and the CPU3 program data into a RAM_B 108.
Figure 4:
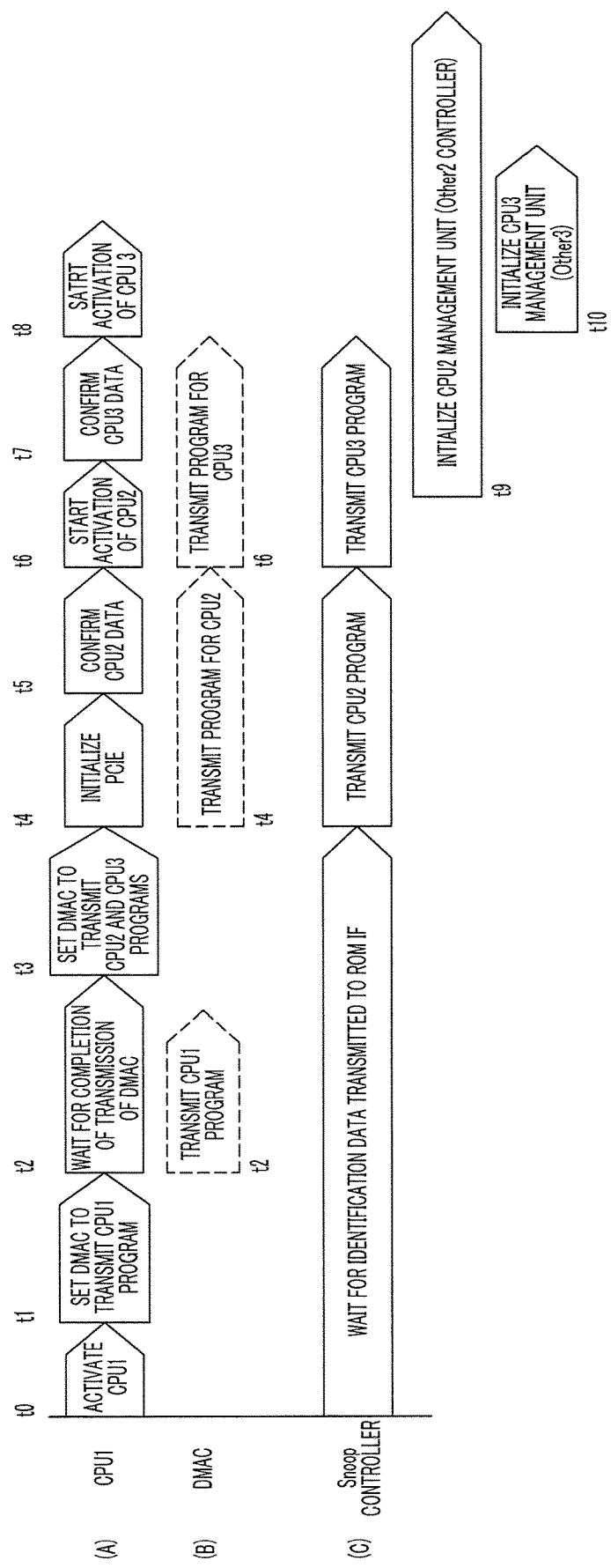
FIG. 4 is a timing chart for the CPU1_112, a DMAC 118, and the snoop controller 180 during the transmission process for the CPU2 program data and the CPU3 program data and the program data storing process.

FIG. 2 is a flowchart illustrating a transmission process for the CPU2 program data and the CPU3 program data, performed by the CPU1_112 executing a CPU1 program. FIG. 3 is a flowchart illustrating a program data storing process, performed by the snoop controller 180, of storing the CPU2 program data and the CPU3 program data into the RAM_B 108. FIG. 4 ((A) to (C)) is a timing chart for the CPU1_112, the DMAC 118, and the snoop controller 180 during the transmission process for the CPU2 program data and the CPU3 program data and the program data storing process.

In a case where power is supplied to the SoC 102 and the ASIC 104, the power is also supplied to the CPU1_112 and the snoop controller 180.

The snoop controller 180 supplied with the power starts the process in FIG. 3, and, in step S252, determines whether or not there is the designated start identification data P2S or start identification data P3S in program data transmitted from the ROM 100 (in FIG. 4, time point t0 to time point t4)

In a case where the CPU1_112 is supplied with the power and is activated (time points t0 to t1), in step S202 (refer to FIG. 2), the CPU1_112 sets the DMAC 118 to transmit the CPU1 program to the RAM_A 106 from the ROM 100 (refer to time points t1 to t2). In step S204, the CPU1_112 determines whether or not transmission of the CPU1 program has been completed.

The DMAC 118 having undergone the setting in step S202 reads the CPU1 program data from the ROM 100, and develops the CPU1 program data into the RAM_A 106 (before time points t2 to t3). The CPU1 program data read by the DMAC 118 is transmitted to and stored into the RAM_A 106 via the bus 101, the ROM controller 114A, the bus 122, and the DRAM controller 116.

As described above, the bus 101 is connected to one end of the bus 103 of which the other end is connected to the snoop controller 180, and thus the CPU1 program data is also transmitted to the snoop controller 180 via the buses 101 and 103. As described above, in step S252 in FIG. 3, the snoop controller 180 determines whether or not there is the designated start identification data P2S or start identification data P3S in the transmitted program data. In other words, the snoop controller 180 determines whether the transmitted program data is the CPU2 program data or the CPU3 program data.

As described above, the CPU1 program data is also transmitted to the snoop controller 180 before time points t2 to t3, and thus a determination result in step S252 is negative. In this case, the snoop controller 180 disregards the transmitted program data (does not store the transmitted program data into the RAM_B 108).

The DMAC 118 switches a status (transmission status) to transmission in progress in a case where program data between the addresses M1 and M2 is read to be developed in the RAM_A 106, and switches the status to transmission completion indicating completion of transmission of the CPU1 program in a case where the development has been completed. In a case where the CPU1_112 checks a status of the DMAC 118, and detects that the status indicates transmission completion, a determination result in step S204 in FIG. 2 is affirmative (time point t3).

In a case where a determination result in step S204 is affirmative, in step S206, the CPU1_112 sets the DMAC 118 to transmit a CPU2 program and successively transmit a CPU3 program (time point t3 to time point t4). In step S208, the CPU1_112 initializes the PCIE 105 (time point t4 to time point t5), and, in step S210, the CPU1_112 determines whether or not transmission of the CPU2 program has been completed (time point t5 to time point t6).

The DMAC 118 that is set to transmit the CPU2 program and successively transmit the CPU3 program reads the CPU2 program data from the ROM 100, and develops the CPU2 program data into the RAM_A 106. The CPU2 program data read by the DMAC 118 is transmitted to and stored into the RAM_A 106 via the bus 101, the ROM controller 114A, the bus 122, and the DRAM controller 116.

The CPU2 program data is also transmitted to the snoop controller 180 via the buses 101 and 103. In this case, first, the DMAC 118 reads the start identification data P2S indicating the head of the CPU2 program data, and transmits the start identification data P2S to the snoop controller 180.

In a case where the start identification data P2S is transmitted to the snoop controller 180, a determination result in step S252 in FIG. 3 is affirmative. In a case where a determination result in step S252 is affirmative, in step S254, the snoop controller 180 starts transmission to a designated address. Specifically, the snoop controller 180 stores the CPU2 program data in order from the address P2A of the RAM_B 108 illustrated in FIG. 5 (time point t4 to time point t6).

Through the process, as illustrated in FIG. 4, while the PCIE 105 is being initialized by the CPU1_112 (time point t4 to time point t5), the CPU2 program data is transmitted to the RAM_B 108 by the snoop controller 180 via the buses 101 and 103, a bus 162, and the DRAM controller 156 instead of the PCIE 105. As mentioned above, the CPU2 program data starts to be transmitted to the RAM_B 108 before initialization of the PCIE 105 is completed.

In the first exemplary embodiment, the initialization of the PCIE 105 and transmission of the CPU2 program data to the RAM_B 108 are started at the identical time point t4, and the initialization of the PCIE 105 is completed before the transmission of the CPU2 program data to the RAM_B 108 is completed.

As described above, in step S210 in FIG. 2, the CPU1_112 determines whether or not the transmission of the CPU2 program has been completed (time point t5 to time point t6).

The DMAC 118 switches a status (transmission status) to completion of transmission of the CPU2 program data in a case where program data between the addresses M2 and M3 is read to be developed in the RAM_B 108. In a case where the CPU1_112 checks a status of the DMAC 118, and detects that the status has switched to completion of transmission of the CPU2 program, a determination result in step S210 in FIG. 2 is affirmative (time point t6).

A status of the snoop controller 180 is made to switch in the same manner as in switching of a status of the DMAC 118. The CPU1_112 may check a status of the snoop controller 180, and may detect whether or not the status has switched to completion of transmission of the CPU2 program data. The CPU1_112 may determine whether or not the CPU2 program is stored in the RAM_A 106.

As described above, since the PCIE 105 is initialized, and transmission of the CPU2 program data to the RAM_B 108 is completed, in step S212, the CPU1_112 cancels reset of the CPU2_152 (start of activation of the CPU2_152: time point t6 to time point t7). Specifically, the CPU1_112 notifies the CPU2_152 of cancelation of reset. This is so that the CPU2_152 is prevented from executing the CPU2 program before the whole program data of the CPU2 program is stored into the RAM_B 108. A CPU2 management unit (other2 controller 160B) is initialized (time point t9).

In step S214, the CPU1_112 determines whether or not transmission of the CPU3 program has been completed (time point t7 to time point t8). In a case where it is determined that transmission of the CPU3 program has been completed, in step S216, the CPU1_112 cancels reset of the CPU3_154. Step Ss S214 and 216 are different from step Ss S210 and 212 in terms of executed programs such as the CPU3 program and the CPU2 program, and thus a description thereof will be omitted. A CPU3 management unit (other3 controller 160C) is initialized (time point t10).

The DMAC 118 transmits the CPU2 program from time point t4 to time point t6, and transmits the CPU3 program from the time point t6 to time point t8.

In step S254 in FIG. 3, the snoop controller 180 also transmits the CPU2 program from time point t4 to time point t6, and transmits the CPU3 program from the time point t6 to time point t8.

In step S256, the snoop controller 180 determines whether or not there is the designated end identification data P3E in the program data transmitted via the buses 101 and 103. The step S256 is repeatedly executed until there is the designated end identification data P3E in the program data transmitted via the buses 101 and 103. In a case where it is determined that there is the designated end identification data P3E in the program data, it is determined that transmission of the CPU3 program has been completed, and the process is finished.

As described above, in the first exemplary embodiment, initialization of the PCIE 105 and transmission of the CPU2 program data to the RAM_B 108 are started at identical time point t4. In other words, the CPU2 program data is transmitted to the RAM_B 108 separately from initialization of the PCIE 105. Therefore, in the first exemplary embodiment, the CPU2 is activated earlier than in the related art in which the CPU2 program data is transmitted after initialization of the PCIE.

In the first exemplary embodiment, the snoop controller 180 is connected to the bus 101 between the ROM 100 and the CPU1_112 via the single bus 103. The number of communication lines is one, and thus a configuration of the multiprocessor system is simplified.

Second Exemplary Embodiment

Since a configuration of a multiprocessor system according to a second exemplary embodiment is substantially same as the configuration of the multiprocessor system according to the first exemplary embodiment, an identical portion is given an identical reference numeral, a description thereof will be omitted, and different portions will be focused.

Figure 6:
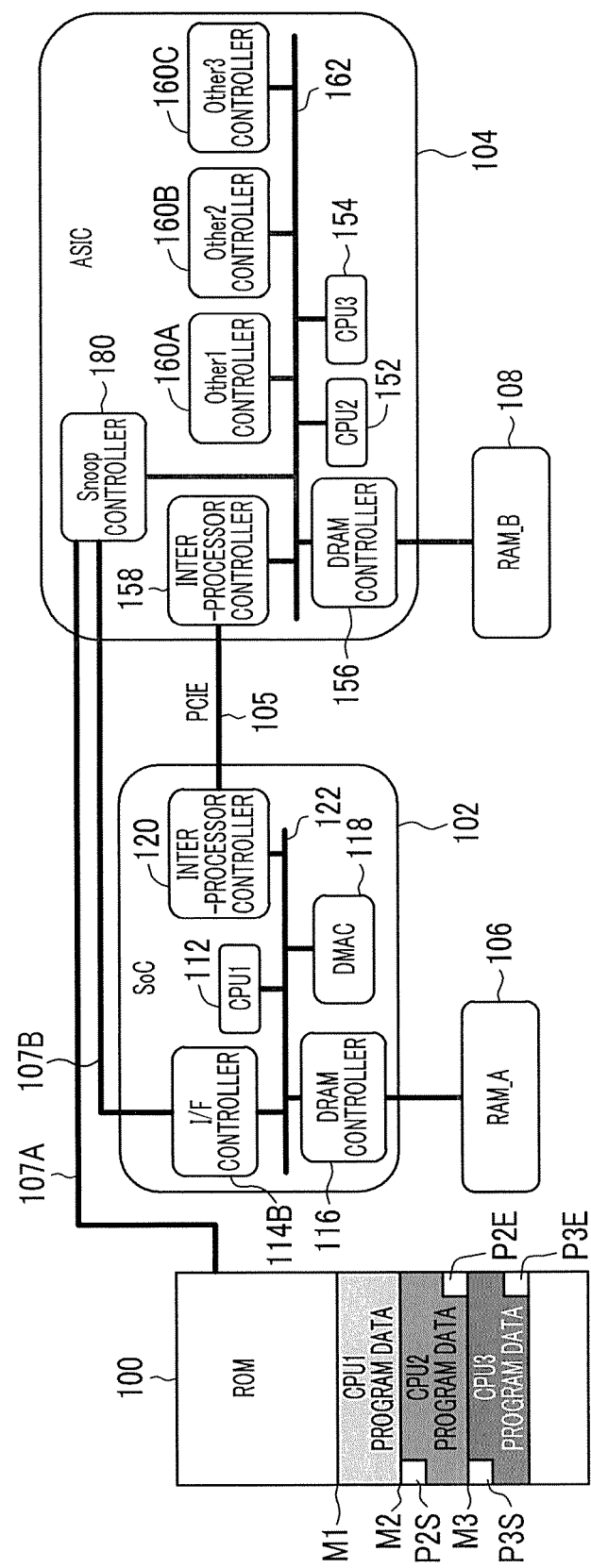
FIG. 6 is a block diagram illustrating a multiprocessor system according to a second exemplary embodiment.

FIG. 6 is a block diagram illustrating the multiprocessor system according to the second exemplary embodiment. As illustrated in FIG. 6, the CPU1_112 and the ROM 100 are connected to each other via the snoop controller 180 and communication lines 107A and 107B. Specifically, the ROM 100 and the snoop controller 180 are connected to each other via the communication line 107A, and the snoop controller 180 and the CPU1_112 are connected to each other via the communication line 107B, an interface (I/F) controller 114B, and the bus 122.

The ROM 100 and the snoop controller 180 are connected to each other on a one-to-one basis (peer to peer), and the snoop controller 180 and the CPU1_112 are connected to each other on a one-to-one basis (peer to peer).

An operation according to the second exemplary embodiment is substantially the same as the operation according to the first exemplary embodiment, and thus a description thereof will be omitted. In the second exemplary embodiment, each piece of program data is transmitted to the RAM_A 106 via the communication line 107A, the snoop controller 180, the communication line 107B, and the SoC 102. Particularly, the CPU2 program data and the CPU3 program data are transmitted to the RAM_B 108 via the communication line 107A and the ASIC 104 (snoop controller 180).

In the second exemplary embodiment, the CPU2 is activated earlier than in the related art in which the CPU2 program data is transmitted after initialization of the PCIE.

The ROM 100 and the snoop controller 180 are connected to each other on a one-to-one basis (peer to peer), and the snoop controller 180 and the CPU1_112 are connected to each other on a one-to-one basis (peer to peer). Therefore, a communication speed is higher than in a case of bus connection.

The snoop controller 180 collectively manages transmission of each program.

MODIFICATION EXAMPLES

First Modification Example

A first modification example will be described. A configuration of the first modification example may be either one of the configurations of the first exemplary embodiment and the second exemplary embodiment.

Figure 7:
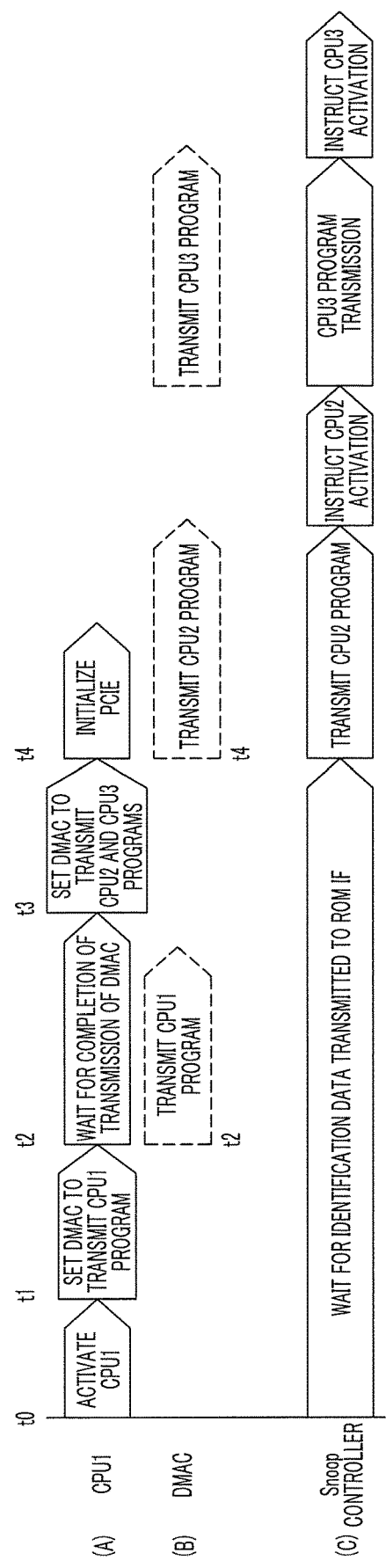
FIG. 7 is a timing chart for a CPU1_112, a DMAC 118, and a snoop controller 180 during a transmission process for CPU2 program data and CPU3 program data and a program data storing process in a first modification example.

A description will be made of an operation according to the first modification example. (A) to (C) of FIG. 7 are respective timing charts for the CPU1_112, the DMAC 118, and the snoop controller 180 during a transmission process for the CPU2 program data and the CPU3 program data and a program data storing process in the first modification example.

In the first exemplary embodiment and the second exemplary embodiment, the CPU1 activates the CPU2 in a case where the CPU2 program is transmitted, but, in the first modification example, the snoop controller 180 activates the CPU2_152 in a case where the CPU2 program is stored in the RAM_B 108.

Second Modification Example

A second modification example will be described. A configuration of the second modification example may be either one of the configurations of the first exemplary embodiment and the second exemplary embodiment.

Figure 8:
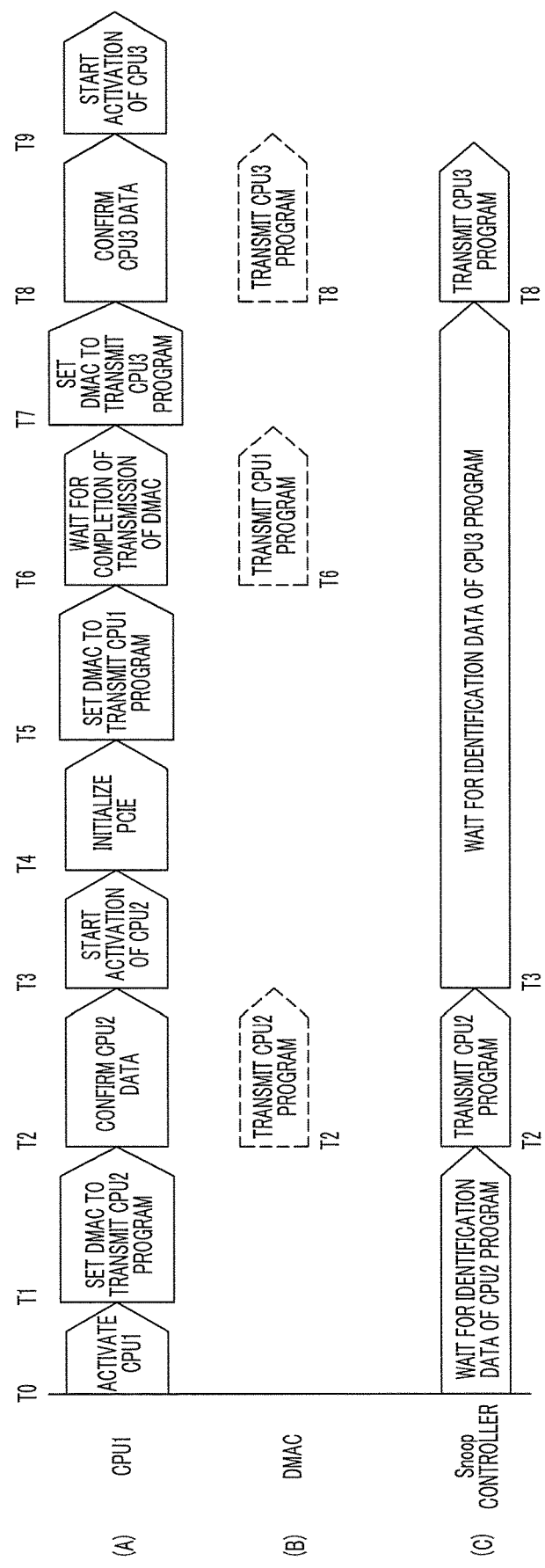
FIG. 8 is a timing chart for a CPU1_112, a DMAC 118, and a snoop controller 180 during a transmission process for CPU2 program data and CPU3 program data and a program data storing process in a second modification example.

A description will be made of an operation according to the second modification example. (A) to (C) of FIG. 8 are respective timing charts for the CPU1_112, the DMAC 118, and the snoop controller 180 during a transmission process for the CPU2 program data and the CPU3 program data and a program data storing process in the second modification example.

In the first exemplary embodiment and the second exemplary embodiment, the CPU2 program is transmitted during initialization of the PCIE 105 (time point t4 to time point t5), but, in the second modification example, the CPU2 program is transmitted (time point T2 to time point T3) before initialization of the PCIE 105 (time point T4). As mentioned above, in the technique of the present disclosure, initialization of the PCIE 105 and the transmission of the CPU2 program data to the RAM_B 108 are performed separately from each other. The CPU2 program starts to be transmitted at least before initialization of the PCIE 105 is completed. Consequently, the CPU2 is activated earlier than in the related art in which the CPU2 program data is transmitted after initialization of the PCIE. In the second modification example, the CPU2 program is transmitted (time point T2 to time point T3) before the CPU1 program data is transmitted (time point T6 to time point T7).

The configurations (refer to FIGS. 1 and 6) of the multiprocessor system described in the exemplary embodiments are only examples, and an unnecessary portion may be deleted or a new portion may be added within the scope without departing from the spirit of the present invention.

The flows (refer to FIGS. 2 and 4) of the processes in the exemplary embodiments are only examples, and, an unnecessary step may be deleted, a new step may be added, or processing orders may be replaced with each other, within the scope without departing from the spirit of the present invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A multiprocessor system including at least a first processor and a second processor, the multiprocessor system comprising:
a storage unit that stores a first program executed by the first processor and a second program executed by the second processor;
a memory unit that has a memory region used by the second processor;
a monitoring unit that is connected to the storage unit and the memory unit via a communication line, and, in a case where a program read from the storage unit is the second program, stores the read second program into the memory unit; and
an inter-processor interface circuit that is provided between the first processor and the second processor; and
a reading unit that reads the first program and the second program stored in the storage unit,
wherein the first processor initializes the inter-processor interface circuit, and
wherein the reading unit starts to read the second program from the storage unit before initialization of the inter-processor interface circuit is completed.

2. The multiprocessor system according to claim 1, wherein the storage unit is connected to the first processor and the monitoring unit via the communication line.

3. The multiprocessor system according to claim 2, wherein the communication line is a bus.

4. The multiprocessor system according to claim 1, wherein the first processor and the storage unit are connected to each other via the monitoring unit and the communication line.

5. The multiprocessor system according to claim 4, wherein the storage unit and the monitoring unit are connected to each other on a one-to-one basis via the communication line, and the monitoring unit and the first processor are connected to each other on a one-to-one basis via the communication line.

6. A multiprocessor system including at least a first processor and a second processor, the multiprocessor system comprising:
   storage means for storing a first program executed by the first processor and a second program executed by the second processor;
   memory means for having a memory region used by the second processor;
   monitoring means, connected to the storage means and the memory means via a communication line, in a case where a program read from the storage means is the second program, for storing the read second program into the memory means; and
   an inter-processor interface circuit that is provided between the first processor and the second processor; and
   a reading unit that reads the first program and the second program stored in the storage means,
   wherein the first processor initializes the inter-processor interface circuit, and
   wherein the reading unit starts to read the second program from the storage means before initialization of the inter-processor interface circuit is completed.

* * * * *